(12) United States Patent
Kim et al.

(10) Patent No.: US 10,186,302 B2
(45) Date of Patent: Jan. 22, 2019

(54) SEMICONDUCTOR SYSTEMS PERFORMING DOUBLE-WRITE OPERATIONS AND METHODS OF OPERATING THE SAME

(71) Applicant: SK hynix Inc., Icheon-si, Gyeonggi-do (KR)

(72) Inventors: Soojin Kim, Icheon-si (KR); Sangwon Lee, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/653,842

(22) Filed: Jul. 19, 2017

(65) Prior Publication Data

US 2018/0211696 A1 Jul. 26, 2018

(30) Foreign Application Priority Data

Jan. 23, 2017 (KR) .......................... 10-2017-0010730

(51) Int. Cl.
| G11C 7/10 | (2006.01) |
| G11C 11/419 | (2006.01) |
| G11C 11/407 | (2006.01) |
| G11C 11/418 | (2006.01) |

(52) U.S. Cl.
CPC .......... *G11C 7/1051* (2013.01); *G11C 7/1072* (2013.01); *G11C 11/407* (2013.01); *G11C 11/418* (2013.01); *G11C 11/419* (2013.01)

(58) Field of Classification Search
CPC ... G11C 7/1051; G11C 7/1072; G11C 11/407; G11C 11/418; G11C 11/419
See application file for complete search history.

(56) References Cited

U.S. PATENT DOCUMENTS

| 5,428,630 | A | * | 6/1995 | Weng | ............... G06F 11/1008 711/141 |
| 7,103,717 | B2 | | 9/2006 | Abe et al. | |
| 8,341,499 | B2 | | 12/2012 | Pescatore | |

* cited by examiner

*Primary Examiner* — James G Norman
(74) *Attorney, Agent, or Firm* — William Park & Associates Ltd.

(57) ABSTRACT

A semiconductor system includes a controller. The controller is configured to have a write buffer that stores first write data outputted from a host before the first write data is written into a memory circuit. The controller is configured to write the first write data stored in the write buffer into the memory circuit under a first condition and configured to double-write the first write data stored in the write buffer into the memory circuit under a second condition.

16 Claims, 13 Drawing Sheets

SEMICONDUCTOR SYSTEMS PERFORMING DOUBLE-WRITE OPERATIONS AND METHODS OF OPERATING THE SAME

CROSS-REFERENCE TO RELATED APPLICATION

The present application claims priority under 35 U.S.C 119(a) to Korean Application No. 10-2017-0010730, filed on Jan. 23, 2017, which is herein incorporated by reference in its entirety.

BACKGROUND

1. Technical Field

Various embodiments of the present disclosure generally relate to semiconductor systems and methods of operating the same and, more particularly, to semiconductor systems performing a double-write operation and methods of operating the semiconductor systems.

2. Related Art

Nonvolatile memory devices retain their stored data even when power supply is interrupted, and data storage units including the nonvolatile memory devices are widely used in portable systems such as smart phones, digital cameras, or computers. The nonvolatile memory devices, particularly, NAND-type flash memory devices have been developed using multi-level cell (MLC) techniques and advanced process techniques to increase the integration density of the NAND-type flash memory devices. The MLC techniques have been proposed to increase the number of bits which are capable of storing data in a single cell, and the advanced process techniques have been proposed to reduce a minimum feature size of patterns constituting memory cells of semiconductor devices. Recently, three-dimensional and vertical cell structures have been developed to overcome the limitation of planar-type memory cell array structures in which memory cells are two dimensionally arrayed and to more efficiently increase the integration density of the NAND-type flash memory devices.

The process techniques for forming fine patterns and the MLC techniques for increasing the number of bits in a limited area may lead to degradation of the reliability of the NAND-type flash memory devices. This is because cell-to-cell interference occurs if a pattern size is reduced and a data error easily occurs if multi-bits are realized in a single cell using the MLC techniques. Meanwhile, in case of the nonvolatile memory devices such as phase change random access memory (PCRAM) devices, magnetoresistive RAM (MRAM) devices, nano floating gate memory (NFGM) devices, resistive RAM (RRAM) devices or polymer RAM devices, a read margin for recognizing a difference between a datum "0" and a datum "1" may be relatively narrow due to the nature of cells. Thus, the nonvolatile memory devices including the PCRAM devices, the MRAM device, the NFGM devices, the RRAM devices and the polymer RAM devices may exhibit a relatively high error rate as compared with the NAND-type flash memory devices even though a single level cell (SLC) structure is employed therein.

Errors, for example, soft errors occurring due to the nature of cells of the nonvolatile memory device during a write operation are referred to as write errors. One of various methods of suppressing write errors is to perform a double-writing operation that writes the same data into the same memory cell more than once. However, if the double-writing operation is performed, the number of accesses to the memory cells increases to cause degradation of endurance and function of the memory cells.

SUMMARY

Various embodiments are directed to semiconductor systems performing a double-write operation and methods of operating the semiconductor systems.

According to an embodiment, a semiconductor system includes a controller. The controller is configured to have a write buffer that stores first write data outputted from a host before the first write data is written into a memory circuit. The controller is configured to write the first write data stored in the write buffer into the memory circuit under a first condition and configured to double-write the first write data stored in the write buffer into the memory circuit under a second condition.

According to another embodiment, a semiconductor system includes a write buffer configured to store write data outputted from a host before the write data is written into a memory circuit, a data selection unit configured to output read data stored in the write buffer or read data stored in the memory circuit, and a controller configured to control an operation of the write buffer and an operation of the data selection unit. The controller is configured to write first write data stored in the write buffer into the memory circuit under a first condition and configured to double-write the first write data stored in the write buffer into the memory circuit under a second condition, during a write operation. The controller is configured to transmit read data stored in the write buffer to the data selection unit if the read data is stored in the write buffer and configured to transmit read data stored in the memory circuit to the data selection unit if the read data is not stored in the write buffer, during a read operation.

According to another embodiment, there is provided a method of operating a semiconductor system including a write buffer coupled between a host and a memory circuit. The method includes performing an error correction code (ECC) encoding operation of write data to generate encoded data according a write command outputted from the host, storing the encoded data in the write buffer, writing the encoded data stored in the write buffer into the memory circuit through a first write route if the memory circuit is in a writable state, and double-writing the encoded data stored in the write buffer into the memory circuit through a second write route if an amount of data stored in the write buffer is greater than or equal to a predetermined level of a total storage capacity of the write buffer. An address of the encoded data double-written into the memory circuit through the second write route is identical to an address of the encoded data written into the memory circuit through the first write route.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

In the following description of the embodiments, it will be understood that the terms "first" and "second" are intended to identify an element, but not used to define only the element itself or to mean a particular sequence. In addition, when an element is referred to as being located "on", "over", "above", "under", or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below", and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Figure 1:
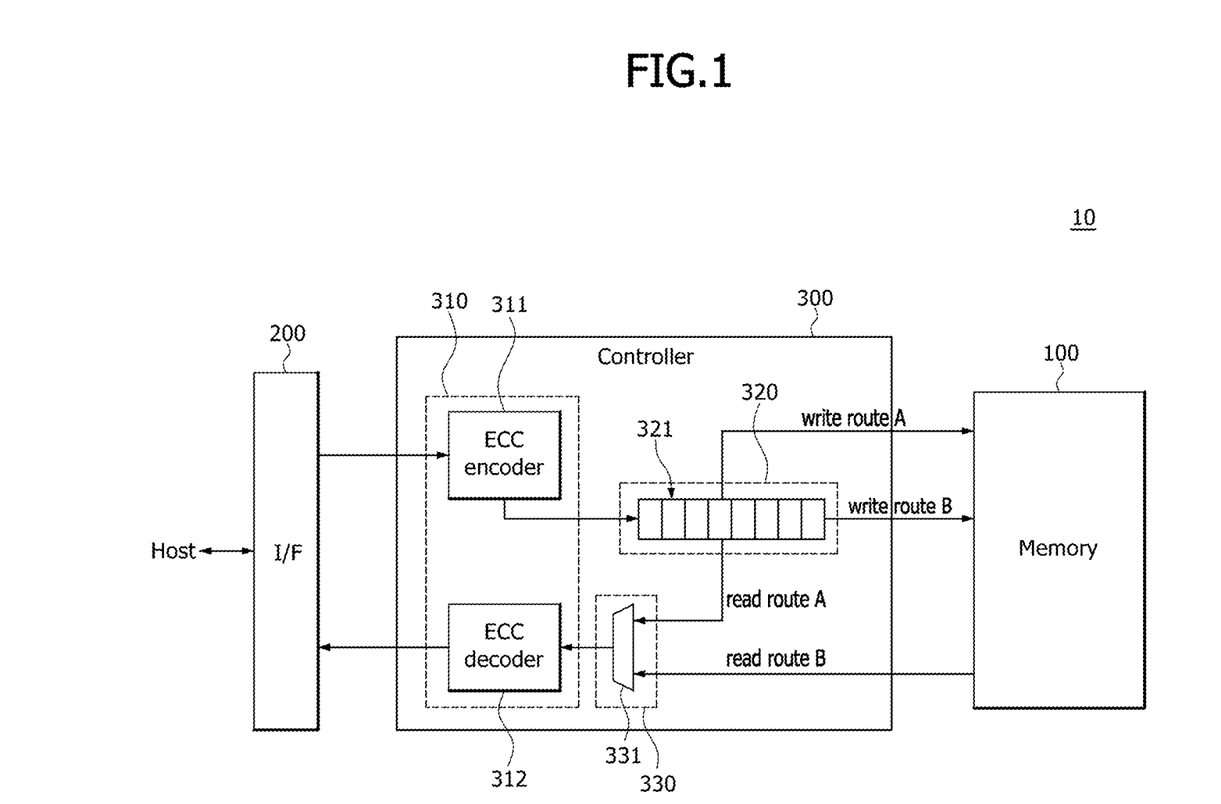
FIG. 1 is a block diagram illustrating a semiconductor system according to an embodiment of the present disclosure.

FIG. 1 is a block diagram illustrating a semiconductor system 10 according to an embodiment of the present disclosure. Referring to FIG. 1, the semiconductor system 10 may be configured to include a memory circuit 100, an interface (I/F) 200, and a controller 300. The controller 300 may communicate with a host through the interface 200 to control an operation of the memory circuit 100. In an embodiment, the memory circuit 100 may be a nonvolatile memory circuit, for example, a NAND-type flash memory circuit, a phase change random access memory (PCRAM) circuit, a magnetroresistive RAM (MRAM) circuit, a nano floating gate memory (NFGM) circuit, a resistive RAM (RRAM) circuit, or a polymer RAM circuit.

The controller 300 may be configured to include an error correction unit 310, a write buffer unit 320, and a data selection unit 330. The error correction unit 310 may include an error correction code (ECC) encoder 311 and an ECC decoder 312. The ECC encoder 311 may perform an ECC encoding operation of write data which is outputted from the host through the interface 200 to generate encoded data. The encoded data generated from the ECC encoder 311 may be transmitted to the write buffer unit 320. The ECC decoder 312 may perform an ECC decoding operation of read data which is outputted from the memory circuit 100 or the write buffer unit 320 through the data selection unit 330 to generate decoded data. The decoded data generated from the ECC decoder 312 may be transmitted to the host through the interface 200.

The write buffer unit 320 may be configured to include a write buffer 321 for storing, in one example, write data outputted from the host before the write data is written into the memory circuit 100. In an embodiment, the write buffer 321 may be realized using a register or a memory which is designed to have a first-in first-out (FIFO) scheme. The write buffer 321 may store the encoded data outputted from the ECC encoder 311. A write path from the write buffer 321 to the memory circuit 100 may include a first write route A and a second write route B. The first write route A may be used in writing data stored in the write buffer 321 into the memory circuit 100 in response to a control signal generated in the controller 300, regardless of a position of the data stored in the write buffer 321. The second write route B may be used in writing data stored in the write buffer 321 into the memory circuit 100 if an amount of data stored in the write buffer 321 is greater than or equal to a level of a total storage capacity of the write buffer 321, for example, a half level of the total storage capacity of the write buffer 321. The data (i.e., the write data or first data) stored in the write buffer 321 may first be written into the memory circuit 100 by the controller 300 through the first write route A under a first condition. Then the data (i.e., the write data or first data) stored in the write buffer 321 may also be written (i.e., double-written) by the controller 300 into the memory circuit 100 through the second write route B under a second condition. Further, if second write data different from the first write data is transmitted to the write buffer 321 in either of the first and second conditions, the controller 300 may store the second write data into the write buffer 321. The controller 300 may write the first write data into the memory circuit 100 under the first condition. In an embodiment, the first condition may correspond to a case that the memory circuit 100 is in a writable state, and the second condition may correspond to a case that an amount of data stored in the write buffer 321 is greater than or equal to a certain level less than or equal to a total storage capacity of the write buffer 321.

The data selection unit 330 may be configured to include a multiplexor 331. The multiplexor 331 may have a first input terminal receiving the write data stored in the write buffer 321 and a second input terminal receiving the read data outputted from the memory circuit 100. The first input terminal of the multiplexor 331 may be coupled to the write buffer 321 through a first read route A. The second input terminal of the multiplexor 331 may be coupled to the memory circuit 100 through a second read route B. The first read route A may be used in transmitting the data stored in the write buffer 321 to the first input terminal of the multiplexor 331 in response to a control signal generated in the controller 300 regardless of a position of the data stored in the write buffer 321, if the read data to be read out of the memory circuit 100 is stored in the write buffer 321 the multiplexor 331 may output the data. The second read route B may be used in transmitting the read data stored in the memory circuit 100 to the second input terminal of the multiplexor 331, if the read data to be read out of the memory circuit 100 is not stored in the write buffer 321 the multiplexor 331 may output the read data. Although not shown in the drawings, the multiplexor 331 may have a control signal input terminal receiving a control signal generated in the controller 300. The multiplexor 331 may selectively output the data inputted from the write buffer 321 through the first input terminal or the data inputted from the memory circuit 100 through the second input terminal to the ECC decoder 312, in response to a control signal generated in the controller 300.

Figure 2:
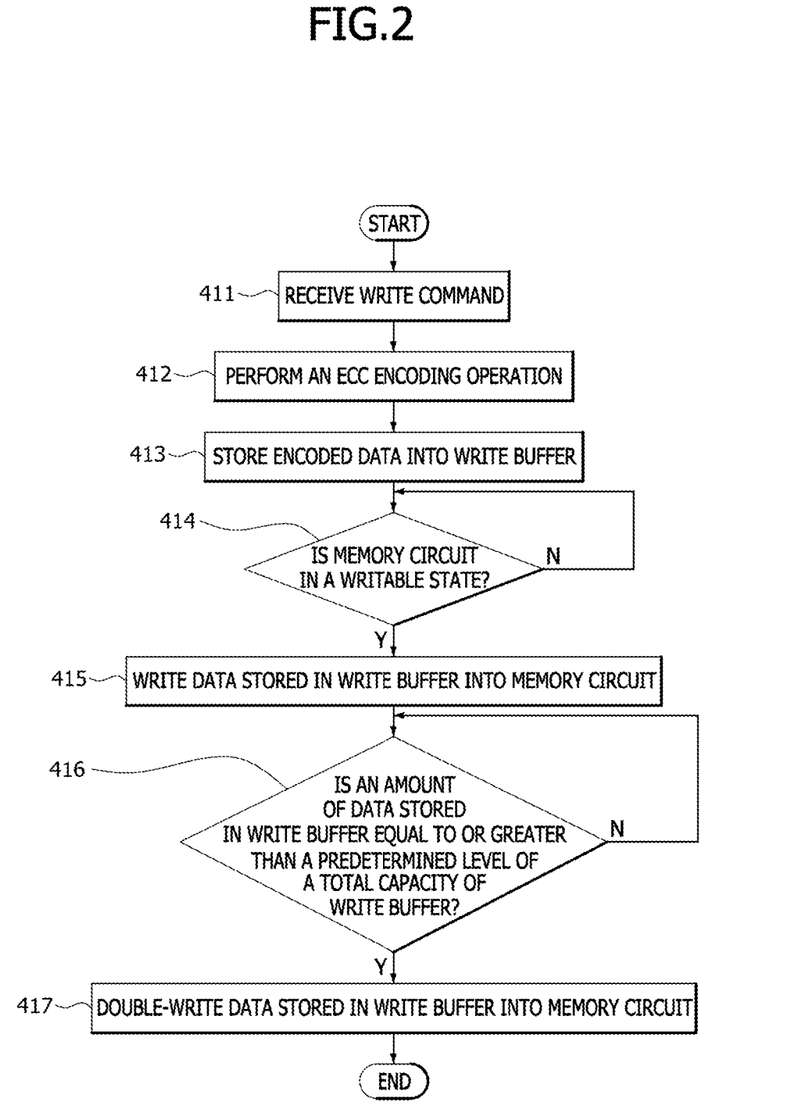
FIG. 2 is a flowchart illustrating an example of a method of writing data into the semiconductor system shown in FIG. 1.
Figure 3:
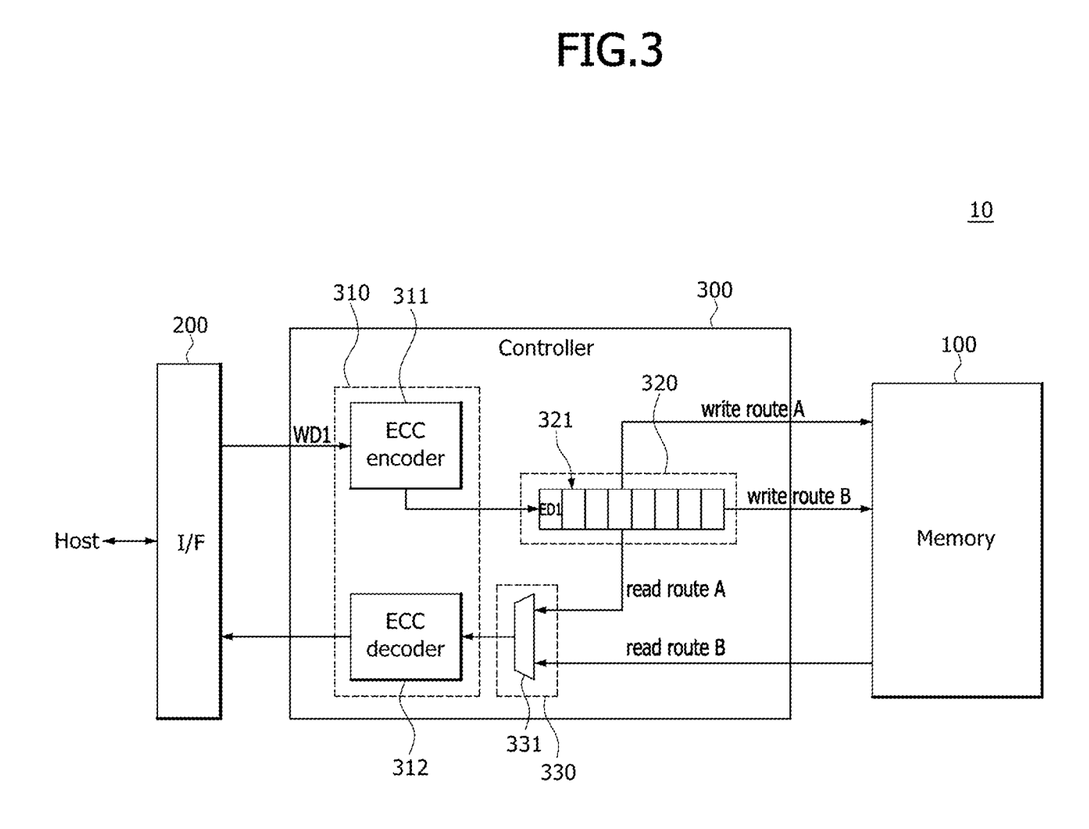
FIGS. 3 to 5 are block diagrams illustrating an example of a method of writing data into the semiconductor system shown in FIG. 1.
Figure 4:
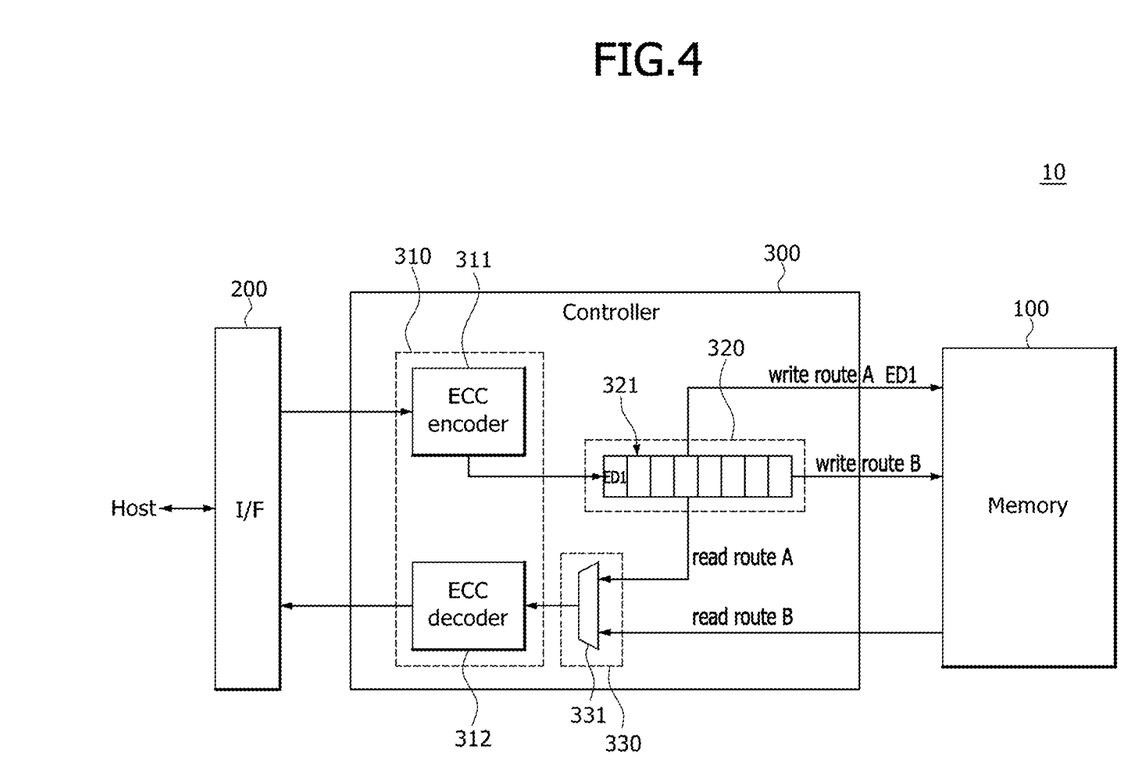
Figure 5:
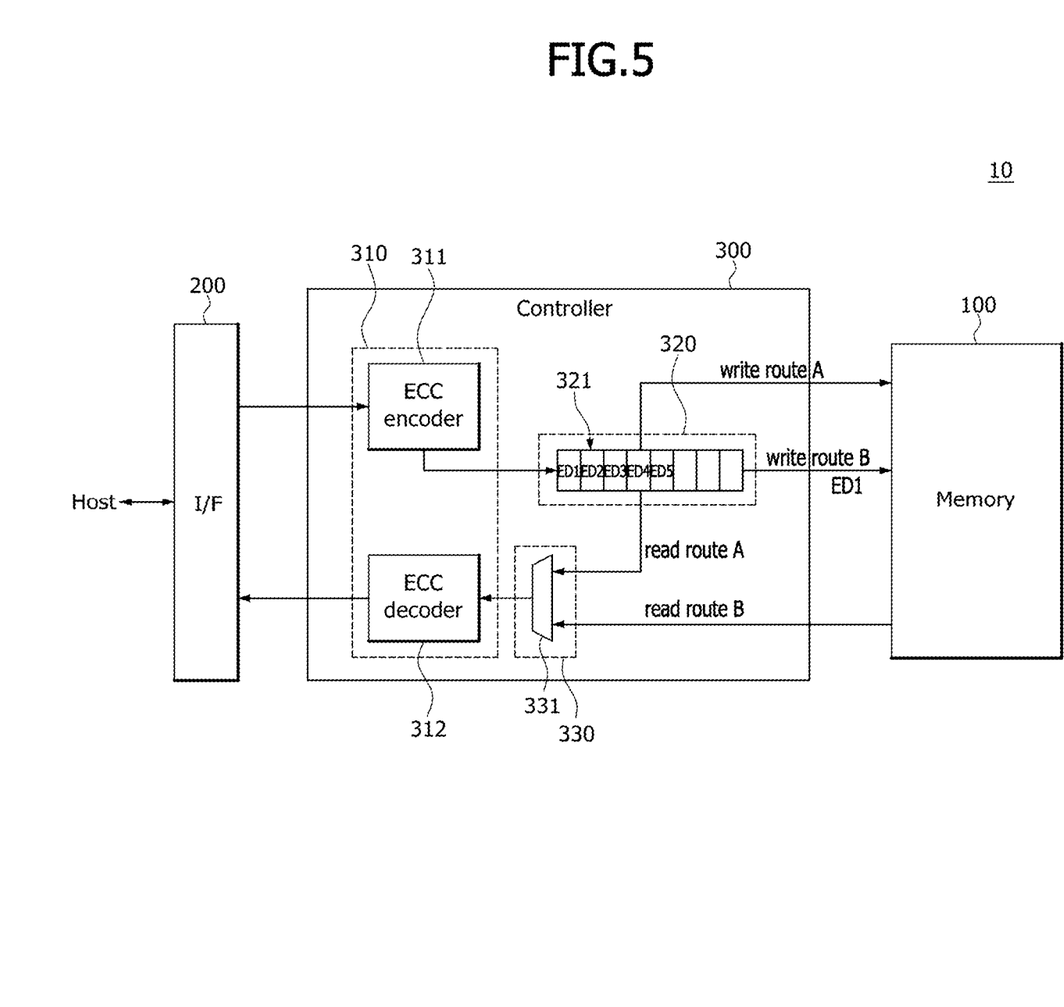

FIG. 2 is a flowchart illustrating a method of writing data into the semiconductor system 10 shown in FIG. 1, and FIGS. 3 to 5 are block diagrams illustrating an example of the method of writing data into the semiconductor system 10 show in FIG. 1. In FIGS. 3 to 5, the same reference numerals as used in FIG. 1 denote the same elements. Referring to FIGS. 2, 3, 4 and 5, if a write command generated from the host is inputted to the semiconductor system 10 (see a step 411 of FIG. 2), write data WD1 transmitted from the host to the controller 300 through the interface 200 may be inputted to the ECC encoder 311 as illustrated in FIG. 3. The ECC encoder 311 of the error correction unit 310 may perform an ECC encoding operation of the write data WD1 (see a step 412 of FIG. 2). In an embodiment, the ECC encoding operation of the write data WD1 may be performed using a Bose-Chaudhuri-Hocquenghem (BCH) code. As a result of the ECC encoding operation of the write data WD1, encoded data ED1 may be outputted from the ECC encoder 311. In an embodiment, the encoded data ED1 may be a binary data stream of a codeword type including parity bits that are necessary for error correction of the write data WD1. The controller 300 may store the encoded data ED1 outputted from the ECC encoder 311 into the write buffer 321 of the write buffer unit 320 (see a step 413 of FIG. 2).

The controller 300 may determine whether the memory circuit 100 is in a writable state (see a step 414 of FIG. 2). If the memory circuit 100 is not in a writable state, the controller 300 may continuously determine whether the memory circuit 100 is in a writable state. If the memory circuit 100 is in a writable state, the controller 300 may first write the encoded data ED1 stored in the write buffer 321 into the memory circuit 100 through the first write route A, as illustrated in FIG. 4 (see a step 415 of FIG. 2). After the controller 300 first writes the encoded data ED1 into the memory circuit 100 through the first write route A, the controller 300 may store information on the achievement of the first record of the encoded data ED1 and information on the address of the encoded data ED1 written in the memory circuit 100 therein. The first information and the second information may be used in a read operation of the encoded data ED1 which is first written in the memory circuit 100. The controller 300 may determine whether an amount of data stored in the write buffer 321 is greater than or equal to a predetermined level of a total storage capacity of the write buffer 321 (see a step 416 of FIG. 2). If an amount of data stored in the write buffer 321 is less than the predetermined level of the total storage capacity of the write buffer 321, the controller 300 may continuously determine whether an amount of data stored in the write buffer 321 is greater than or equal to the predetermined level of the total storage capacity of the write buffer 321. If an amount of data (e.g., ED1~ED5) stored in the write buffer 321 is greater than or equal to the predetermined level, for example, a half level of the total storage capacity of the write buffer 321 as illustrated in FIG. 5, the encoded data ED1 stored in the write buffer 321 may be double-written into the memory circuit 100 through the second write route B (see a step 417 of FIG. 2). In such a case, the encoded data ED1 double-written into the memory circuit 100 are not stored in the write buffer 321 any more. An address of the encoded data ED1 double-written into the memory circuit 100 may be identical to an address of the encoded data ED1 first written into the memory circuit 100.

Figure 6:
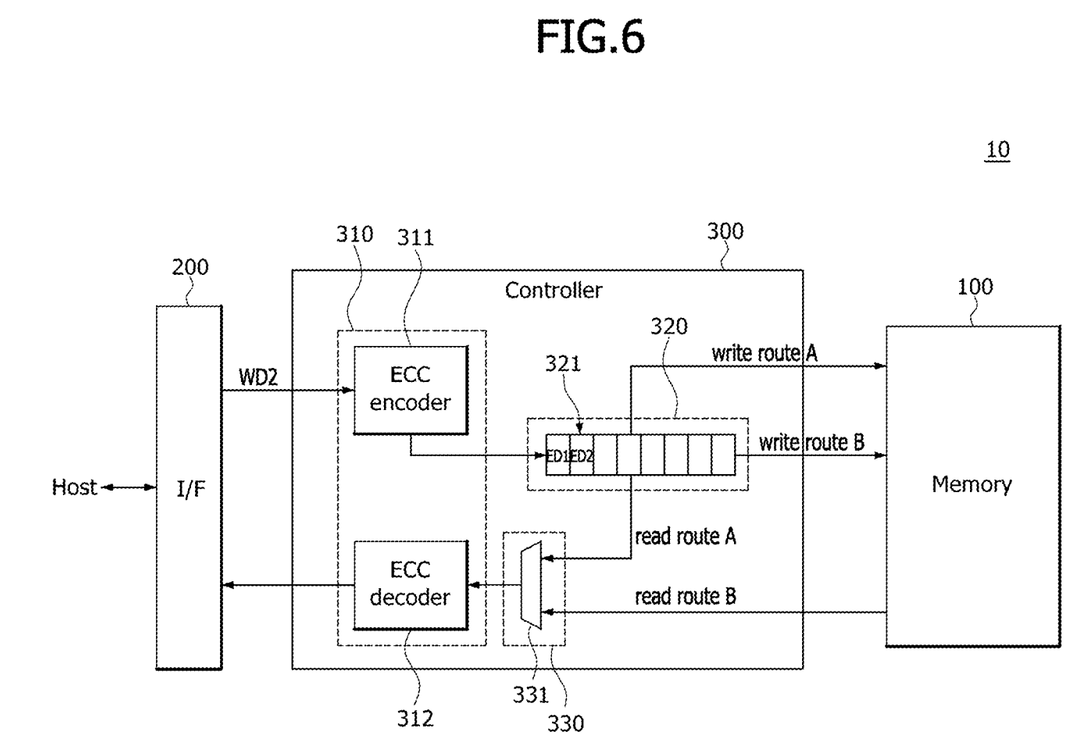
FIGS. 6 to 8 are block diagrams illustrating another example of a method of writing data into the semiconductor system shown in FIG. 1.

FIGS. 6 to 8 are block diagrams illustrating another example of the method of writing data into the semiconductor system 10 shown in FIG. 1. In FIGS. 6 to 8, the same reference numerals as used in FIG. 1 denote the same elements. First, the steps 411 to 413 of FIG. 2 are performed. As a result, the first encoded data ED1 may be stored in the write buffer 321, as illustrated in FIG. 6. If a write command of second write data WD2 is transmitted from the host to the controller 300 while the memory circuit 100 is not in a writable state, the ECC encoder 311 of the error correction unit 310 may perform an ECC encoding operation of the second write data WD2. As a result of the ECC encoding operation of the second write data WD2, second encoded data ED2 may be outputted from the ECC encoder 311, and the second encoded data ED2 may be stored in the write buffer 321 of the write buffer unit 320. In such a case, no encoded data stored in the write buffer 321 is written into the memory circuit 100.

Figure 7:
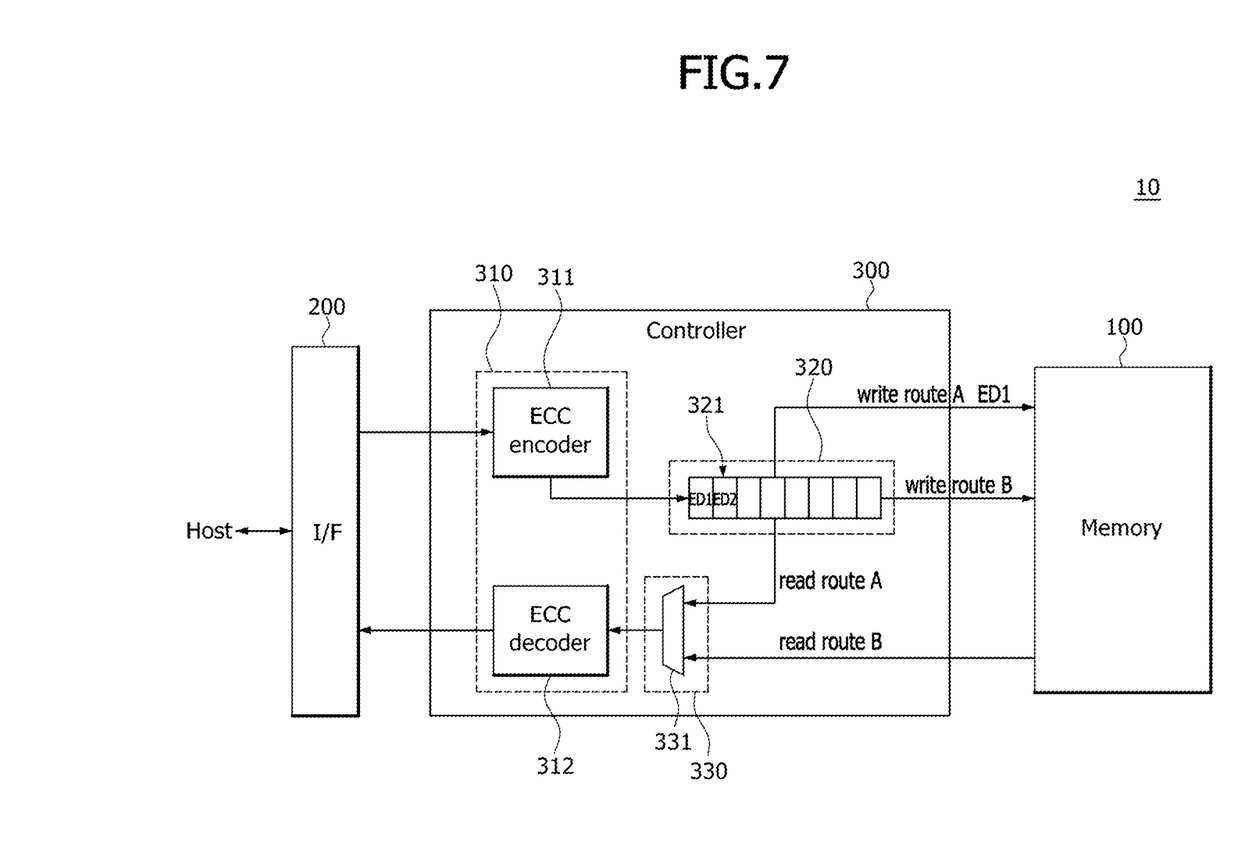
Figure 8:
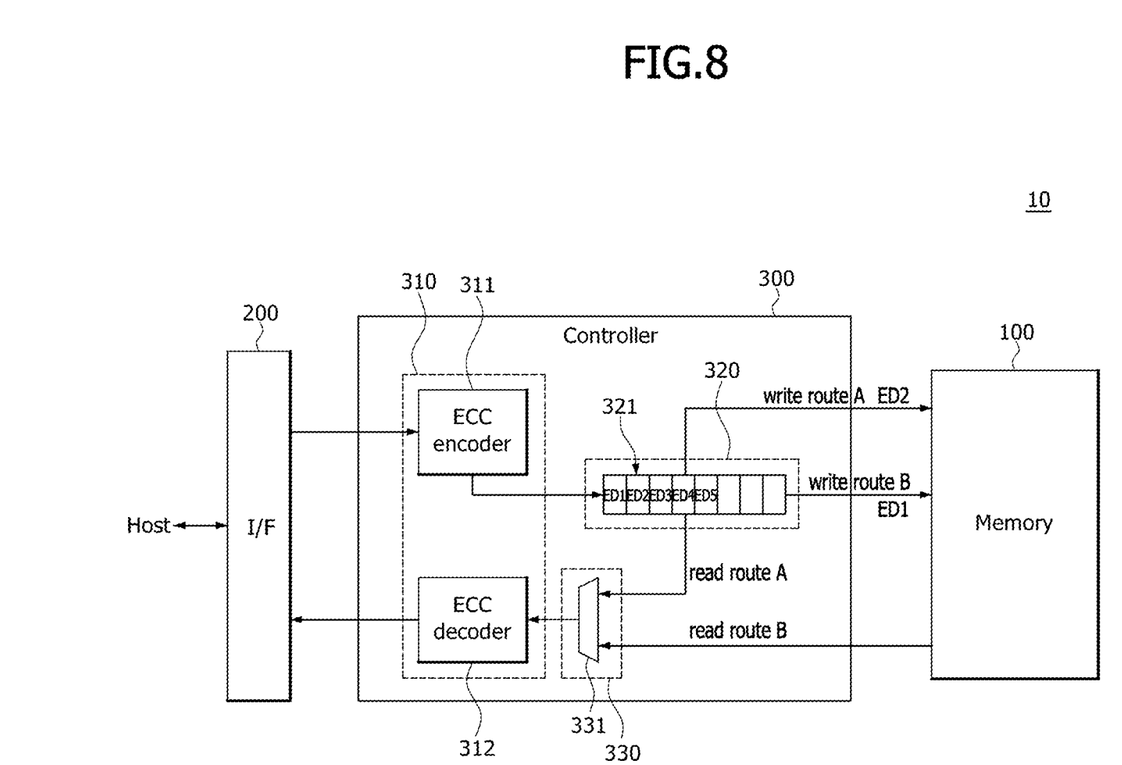

If the memory circuit 100 is in a writable state while no encoded data stored in the write buffer 321 is written into the memory circuit 100, the first encoded data ED1 first stored in the write buffer 321 may first be written into the memory circuit 100 through the first write route A, as illustrated in FIG. 7. If the memory circuit 100 still maintains the writable state even after the first encoded data ED1 is first written into the memory circuit 100, the second encoded data ED2 may first be written into the memory circuit 100 through the first write route A. However, if the memory circuit 100 is out of the writable state after the first encoded data ED1 is first written into the memory circuit 100, the controller 300 may continuously determine whether the memory circuit 100 is in a writable state. Subsequently, if an amount of data (e.g., ED1~ED5) stored in the write buffer 321 is greater than or equal to a predetermined level, for example, half of a total storage capacity of the write buffer 321 as illustrated in FIG. 8, the encoded data ED1 stored in the write buffer 321 may be double-written into the memory circuit 100 through the second write route B while the second encoded data ED2 stored in the write buffer 321 is first written into the memory circuit 100 through the first write route A. In such a case, the first encoded data ED1 double-written into the memory circuit 100 is not stored in the write buffer 321 any more. An address of the first encoded data ED1 double-written into the memory circuit 100 may be identical to an address of the first encoded data ED1 first written into the memory circuit 100. The second encoded data ED2 stored in the write buffer 321 may be double-written into the memory circuit 100 if an amount of data stored in the write buffer 321 is greater than or equal to the predetermined level of the total storage capacity of the write buffer 321 again.

As described above, according to a method of writing data into a semiconductor system, the write data may be stored in a write buffer and the write data stored in the write buffer may then be written in a memory circuit in a specific condition, without directly writing the write data into the memory circuit. Thus, a write latency of the semiconductor system may be reduced during a write operation. In addition, even while the write data is stored in the write buffer, it may be possible to access to the memory circuit. Accordingly, a read latency of the semiconductor system may also be reduced during a read operation. Particularly, in a double-writing scheme for suppressing write errors, the double-writing operation may be performed in a specific condition of the memory circuit while the write data is stored in the write buffer. Thus, it may be possible to prevent degradation of performance of the memory circuit due to the double-writing operation.

Figure 9:
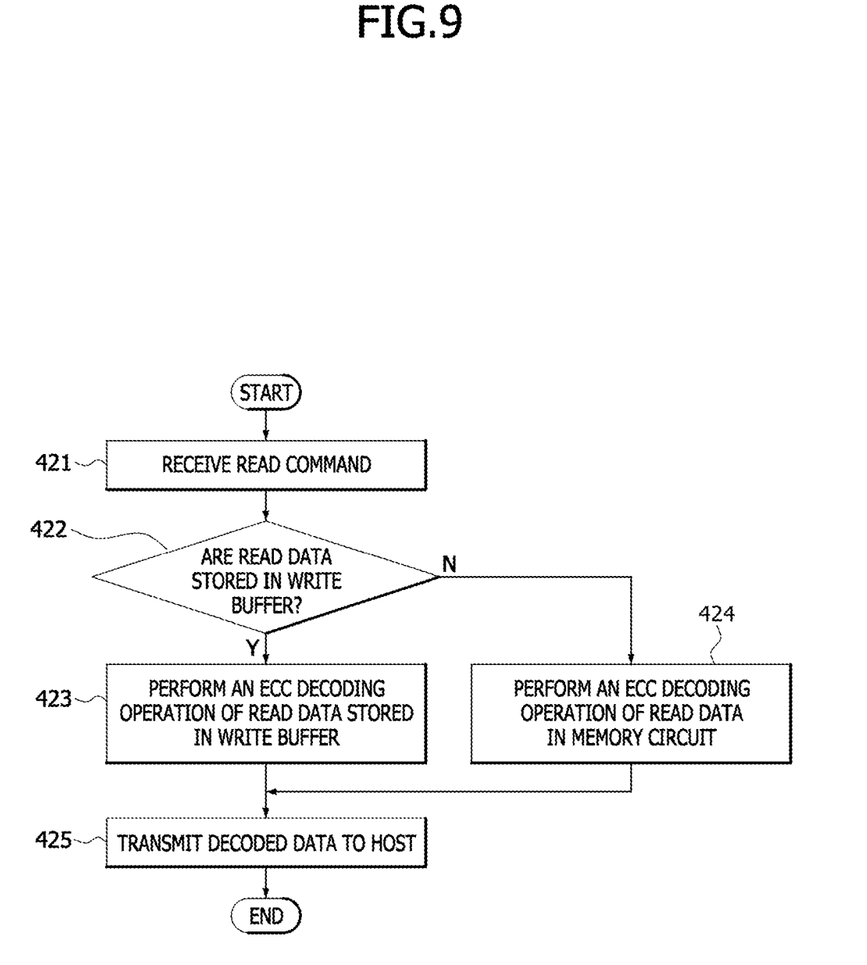
FIG. 9 is a flowchart illustrating an example of a method of reading data of the semiconductor system shown in FIG. 1.
Figure 10:
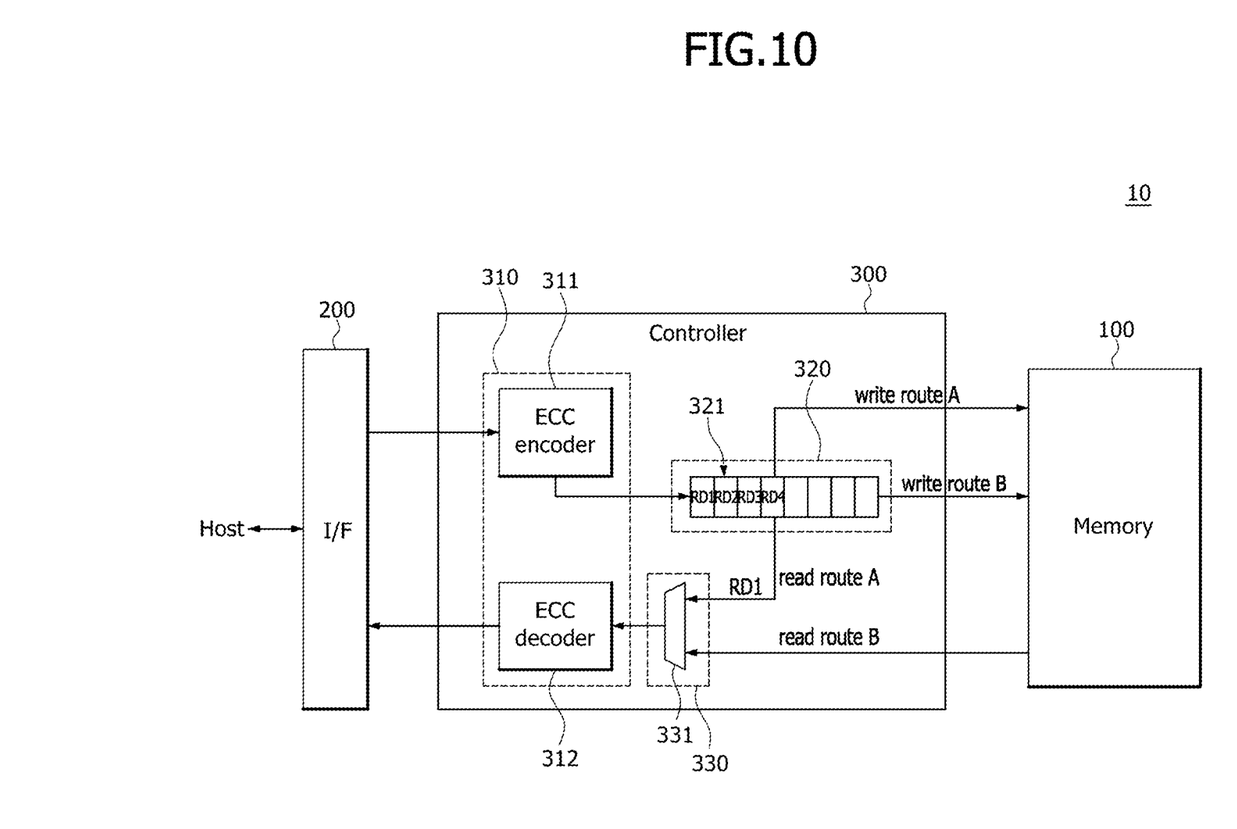
FIGS. 10 to 12 are block diagrams illustrating an example of a method of reading data of the semiconductor system shown in FIG. 1.
Figure 11:
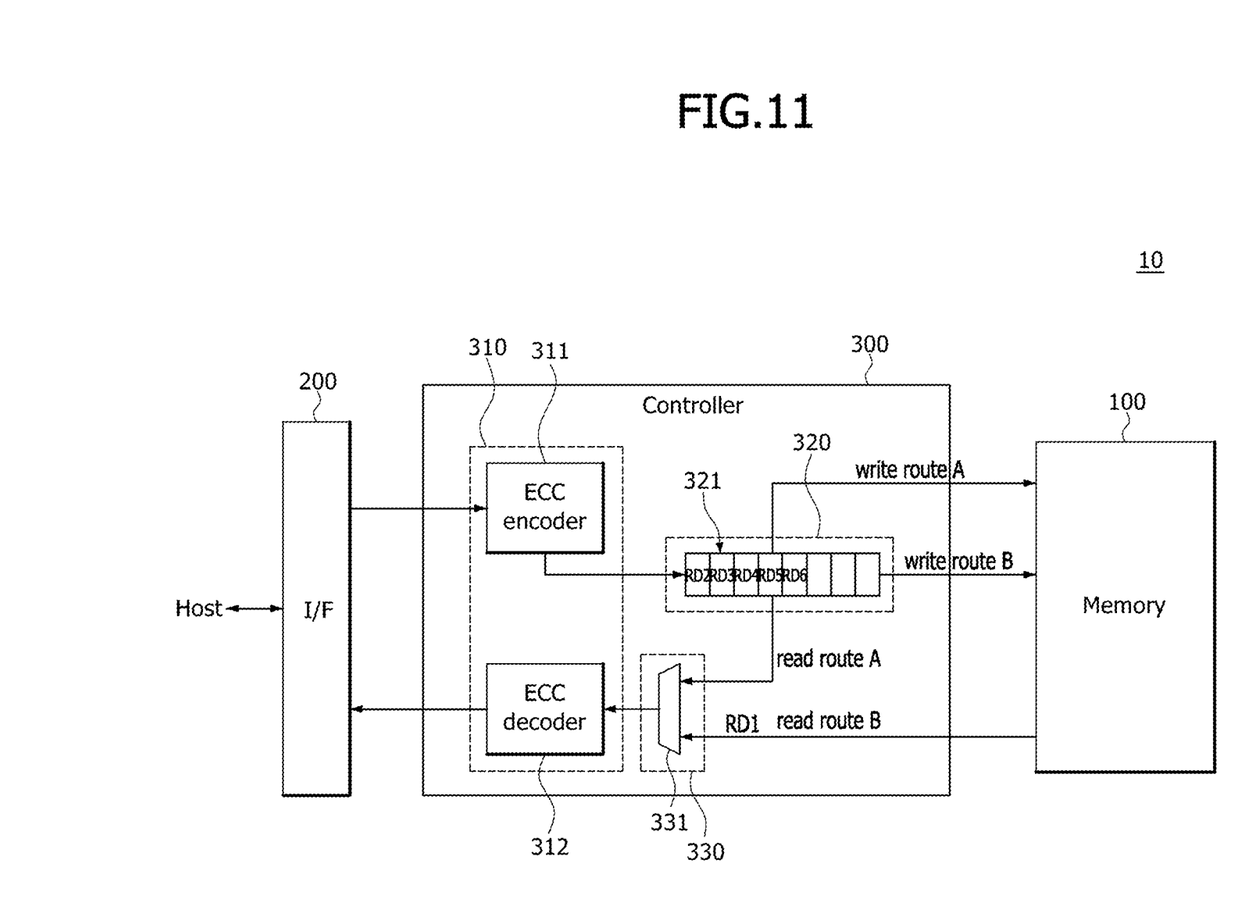
Figure 12:
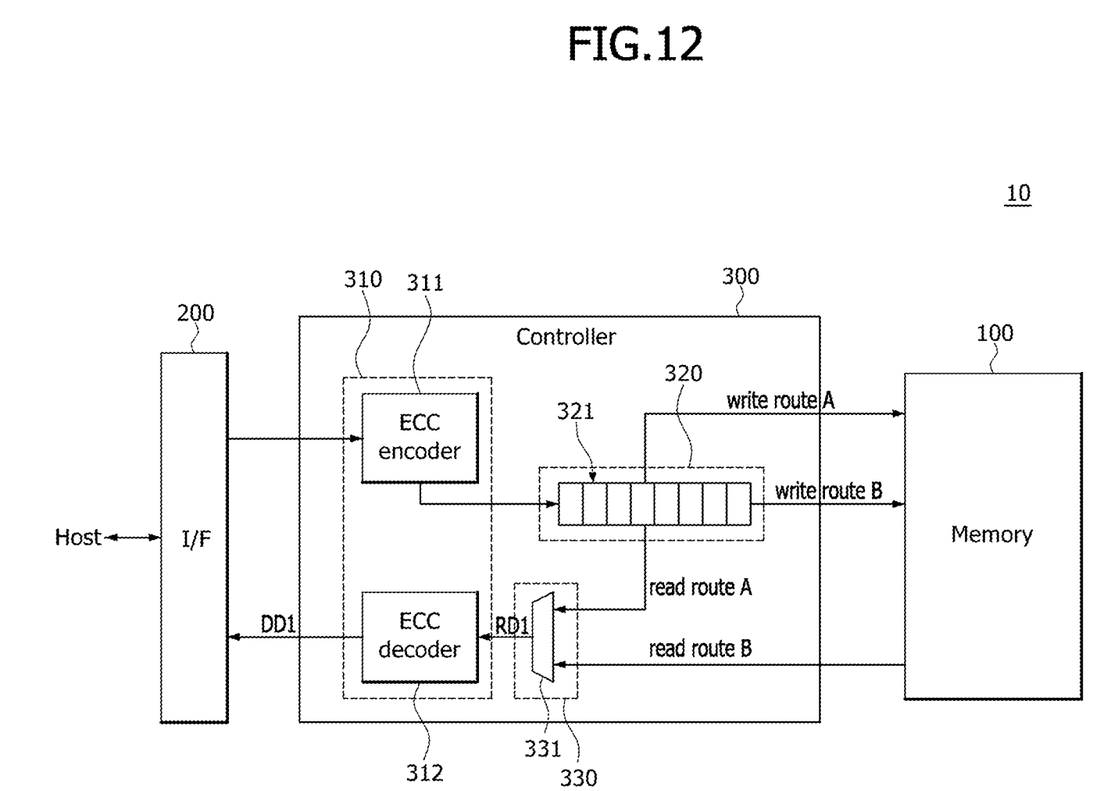

FIG. 9 is a flowchart illustrating an example of a method of reading data of the semiconductor system 10 shown in FIG. 1, and FIGS. 10 to 12 are block diagrams illustrating an example of a method of reading data of the semiconductor system 10 shown in FIG. 1. In FIGS. 10 to 12, the same reference numerals as used in FIG. 1 denote the same elements. Referring to FIGS. 9, 10, 11 and 12, if a read command generated from the host is inputted to the semiconductor system 10 (see a step 421 of FIG. 9), the controller 300 may determine whether read data is stored in the write buffer 321 (see a step 422 of FIG. 9). If the read data is stored in the write buffer 321, the read data RD1 stored in the write buffer 321 may be transmitted to the first input terminal of the multiplexor 331 through the first read route A as illustrated in FIG. 10. The controller 300 may generate a control signal, and the multiplexor 331 may output the read data RD1 transmitted to the first input terminal of the multiplexor 331 in response to the control signal. The read data RD1 outputted from the multiplexor 331 may be inputted to the ECC decoder 312 of the error correction unit 310. The ECC decoder 312 may perform an ECC decoding operation of the read data RD1 (see a step 423 of FIG. 9) to generate decoded data DD1. As a result of the ECC decoding operation of the read data RD1, decoded data DD1 may be outputted from the ECC decoder 312, as illustrated in FIG. 12. The controller 300 may transmit the decoded data DD1 outputted from the ECC decoder 312 to the host through the interface 200 (see a step 425 of FIG. 9).

In the step 422 of FIG. 9, if no read data is stored in the write buffer 321, that is, the read data is double-written into the memory circuit 100 so that the read data is deleted from write buffer 321, the read data RD1 stored in the memory circuit 100 may be transmitted to the second input terminal of the multiplexor 331 through the second read route B as illustrated in FIG. 11. The controller 300 may generate a control signal, and the multiplexor 331 may output the read data RD1 transmitted to the second input terminal of the multiplexor 331 in response to the control signal. The read data RD1 outputted from the multiplexor 331 may be inputted to the ECC decoder 312 of the error correction unit 310. The ECC decoder 312 may perform an ECC decoding operation of the read data RD1 (see a step 424 of FIG. 9). As a result of the ECC decoding operation of the read data RD1, decoded data DD1 may be outputted from the ECC decoder 312, as illustrated in FIG. 12. The controller 300 may transmit the decoded data DD1 outputted from the ECC decoder 312 to the host through the interface 200 (see the step 425 of FIG. 9).

As described above, according to a method of reading data of a semiconductor system, if read data is stored in a write buffer, the semiconductor system may read out the read data stored in the write buffer without reading data stored in a memory circuit of the semiconductor system. Thus, a read latency of the semiconductor system may be reduced. In addition, because the read data stored in the write buffer are directly read out, the number of accesses to the memory circuit may be reduced to improve the endurance of the memory circuit. Furthermore, an ECC encoding operation and an ECC decoding operation may be used during a write operation and a read operation to reduce a probability of soft error occurrence.

Figure 13:
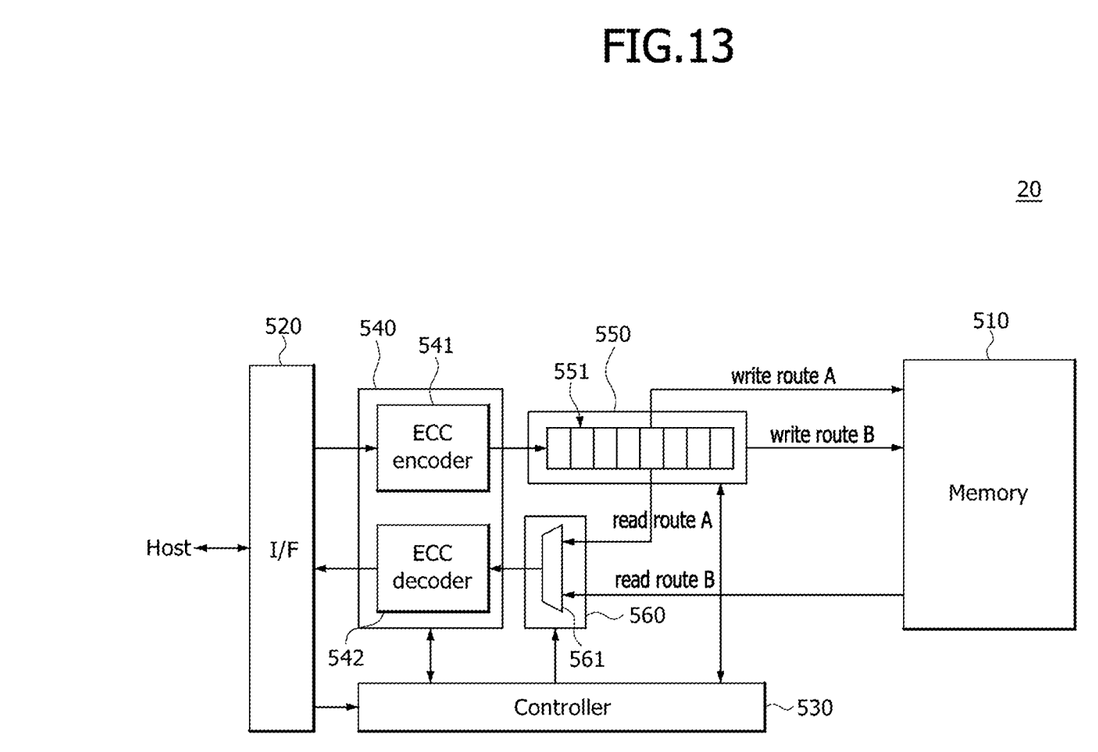
FIG. 13 is a block diagram illustrating a semiconductor system according to another embodiment of the present disclosure.

FIG. 13 is a block diagram illustrating a semiconductor system 20 according to another embodiment of the present disclosure. Referring to FIG. 13, the semiconductor system 20 may be configured to include a memory circuit 510, an interface 520, a controller 530, an error correction unit 540, a write buffer unit 550, and a data selection unit 560. The controller 530 may communicate with a host through the interface 520 to control an operation of the memory circuit 510. The error correction unit 540, the write buffer unit 550, and the data selection unit 560 may be excluded from the controller 530 and separately disposed from the controller 530. The error correction unit 540, the write buffer unit 550, and the data selection unit 560 may be controlled by the controller 530 during a write operation for writing data into the memory circuit 510 and during a read operation for reading out the data in the memory circuit 510 or the write buffer unit 550.

The error correction unit 540 may include an ECC encoder 541 and an ECC decoder 542. The ECC encoder 541 may perform an ECC encoding operation of write data, which is outputted from the host through the interface 520, to generate encoded data, in response to a control signal outputted from the controller 530. The encoded data generated from the ECC encoder 541 may be transmitted to the write buffer unit 550. The ECC decoder 542 may perform an ECC decoding operation of read data, which is outputted from the memory circuit 510 or the write buffer unit 550 through the data selection unit 560, to generate decoded data, in response to a control signal outputted from the controller 530. The decoded data generated from the ECC decoder 542 may be transmitted to the host through the interface 520.

The write buffer unit 550 may be configured to include a write buffer 551. In an embodiment, the write buffer 551 may be realized using a register or a memory which is designed to have a first-in first-out (FIFO) scheme. The write buffer 551 may store the encoded data outputted from the ECC encoder 541. A write path from the write buffer 551 to the memory circuit 510 may include a first write route A and a second write route B. The first write route A may be used in writing data stored in the write buffer 551 into the memory circuit 510 in response to a control signal generated in the controller 530, regardless of a position of the data stored in the write buffer 551. The second write route B may be used in writing data stored in the write buffer 551 into the memory circuit 510 if an amount of the data stored in the write buffer 551 is greater than or equal to a certain level of a total storage capacity of the write buffer 551, for example, half of the total storage capacity of the write buffer 551. The data (i.e., the write data) stored in the write buffer 551 may first be written into the memory circuit 510 through the first write route A in a first condition. The data (i.e., the write data) stored in the write buffer 551 may be double-written into the memory circuit 510 through the second write route B in a second condition. In an embodiment, the first condition may correspond to a case that the memory circuit 510 is in a writable state, and the second condition may correspond to a case that an amount of data stored in the write buffer 551 is greater than or equal to a certain level of a total storage capacity of the write buffer 551.

The data selection unit 560 may be configured to include a multiplexor 561. The multiplexor 561 may have a first input terminal receiving the write data stored in the write buffer 551 and a second input terminal receiving the read data outputted from the memory circuit 510. The first input terminal of the multiplexor 561 may be coupled to the write buffer 551 through a first read route A. The second input terminal of the multiplexor 561 may be coupled to the memory circuit 510 through a second read route B. The first read route A may be used in transmitting the data stored in the write buffer 551 to the first input terminal of the multiplexor 331 in response to a control signal generated in the controller 530 regardless of a position of the data stored in the write buffer 551, if the read data to be read out of the memory circuit 510 is left in the write buffer 551. The second read route B may be used in transmitting the read data stored in the memory circuit 510 to the second input terminal of the multiplexor 561, if the read data to be read out of the memory circuit 510 is not left in the write buffer 551. The multiplexor 561 may have a control signal input terminal receiving a control signal generated in the controller 530. An output terminal of the multiplexor 561 may be coupled to the ECC decoder 542 of the error correction unit 540. The multiplexor 561 may selectively output the data inputted from the write buffer 551 through the first input terminal or the data inputted from the memory circuit 510 through the second input terminal to the ECC decoder 542, in response to a control signal generated in the controller 530.

A method of writing data into the semiconductor system 20 may be substantially the same as the method of writing data into the semiconductor system 10 which is described with reference to FIGS. 2 and 9, and a method of reading out data of the semiconductor system 20 may also be substantially the same as the method of reading out data of the semiconductor system 10 which is described with reference to FIGS. 2 and 9. The embodiment illustrated in FIG. 13 may differ from the embodiment illustrated in FIG. 1 in terms of a configuration of a controller. That is, while the controller 300 of the semiconductor system 10 illustrated in FIG. 1 is configured to include the error correction unit 310, the write buffer unit 320, and the data selection unit 330, the controller 530 of the semiconductor system 20 illustrated in FIG. 13 may be separate from the error correction unit 540, the write buffer unit 550, and the data selection unit 560. Thus, operations of the error correction unit 540, the write buffer unit 550, and the data selection unit 560 may be controlled by a control signal outputted from the controller 530.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A semiconductor system comprising:
    a controller configured to have a write buffer storing first write data outputted from a host before the first write data is written into a memory circuit,
    wherein the controller is configured to write the first write data stored in the write buffer into the memory circuit under a first condition and configured to double-write the first write data stored in the write buffer into the memory circuit under a second condition;
    wherein the first condition corresponds to a case that the memory circuit is in a writable state; and
    wherein the second condition corresponds to a case that an amount of data stored in the write buffer is greater than or equal to a predetermined level of a total storage capacity of the write buffer.

2. The semiconductor system of claim 1, wherein an address of the first write data written into the memory circuit under the first condition is identical to an address of the first write data double-written into the memory circuit under the second condition.

3. The semiconductor system of claim 1, wherein the first write data stored in the write buffer is transmitted to the memory circuit through a first write route or a second write route.

4. The semiconductor system of claim 3,
    wherein the first write route is used in writing the first write data into the memory circuit under the first condition; and
    wherein the second write route is used in double-writing the first write data into the memory circuit under the second condition.

5. The semiconductor system of claim 1, wherein if second write data different from the first write data is transmitted to the write buffer under the first and second conditions, the controller stores the second write data into the write buffer.

6. The semiconductor system of claim 5,
    wherein the controller writes the first write data into the memory circuit under the first condition; and
    wherein while the first write data is double-written into the memory circuit under the second condition, the controller writes the second write data into the memory circuit.

7. The semiconductor system of claim 1, further comprising an error correction code (ECC) encoder configured to perform an ECC encoding operation of the first write data to generate encoded data and configured to store the encoded data into the write buffer.

8. The semiconductor system of claim 1, further comprising a data selection unit configured to transmit data stored in the write buffer or data outputted from the memory circuit to the host.

9. The semiconductor system of claim 8, wherein the data selection unit includes a multiplexor having a first input terminal receiving read data stored in the write buffer and a second input terminal receiving read data outputted from the memory circuit.

10. The semiconductor system of claim 9, wherein the multiplexor is configured to output the read data stored in the write buffer if the read data is stored in the write buffer and configured to output the read data stored in the memory circuit if the read data is not stored in the write buffer.

11. The semiconductor system of claim 10, further comprising an error correction code (ECC) decoder configured to perform an ECC decoding operation of the read data outputted from the multiplexor to generate decoded data and configured to transmit the decoded data to the host.

12. The semiconductor system of claim 1, wherein the write buffer is realized using a register or a memory which is designed to have a first-in first-out (FIFO) scheme.

13. A semiconductor system comprising:
    a write buffer configured to store write data outputted from a host before the write data is written into a memory circuit;
    a data selection unit configured to output read data stored in the write buffer or read data stored in the memory circuit; and
    a controller configured to control an operation of the write buffer and an operation of the data selection unit,
    wherein the controller is configured to write first write data stored in the write buffer into the memory circuit under a first condition and configured to double-write the first write data stored in the write buffer into the memory circuit under a second condition, during a write operation, and
    wherein the controller is configured to transmit read data stored in the write buffer to the data selection unit if the read data is stored in the write buffer and configured to transmit read data stored in the memory circuit to the data selection unit if the read data is not stored in the write buffer, during a read operation, and
    wherein in the first condition the memory circuit is in a writable state, and in the second condition an amount of data stored in the write buffer is greater than or equal to a level less than or equal to a total storage capacity of the write buffer.

14. The semiconductor system of claim 13, wherein the data selection unit includes a multiplexor having a first input terminal receiving read data stored in the write buffer and a second input terminal receiving read data outputted from the memory circuit.

15. The semiconductor system of claim 13, further comprising:
- an error correction code (ECC) encoder configured to perform an ECC encoding operation of the write data outputted from the host to generate encoded data and configured to output the encoded data as the first write data which is stored into the write buffer, in response to a control signal outputted from the controller; and
- an ECC decoder configured to perform an ECC decoding operation of read data outputted from the data selection unit to generate decoded data and configured to transmit the decoded data to the host, in response to a control signal outputted from the controller.

16. The semiconductor system of claim 13, wherein the write buffer is realized using a register or a memory which is designed to have a first-in first-out (FIFO) scheme.

* * * * *